(12) United States Patent
Breitwisch et al.

(10) Patent No.: US 7,935,564 B2
(45) Date of Patent: May 3, 2011

(54) SELF-CONVERGING BOTTOM ELECTRODE RING

(75) Inventors: Matthew J. Breitwisch, Yorktown Heights, NY (US); Chung H. Lam, Peekskill, NY (US); Hsiang-Lan Lung, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 12/036,372

(22) Filed: Feb. 25, 2008

(65) Prior Publication Data

US 2009/0212272 A1  Aug. 27, 2009

(51) Int. Cl.
*H01L 47/00* (2006.01)

(52) U.S. Cl. ............ 438/84; 438/900; 365/163; 257/2; 257/4; 257/E47.001; 257/E47.005

(58) Field of Classification Search ........ 257/2; 438/84, 438/900
See application file for complete search history.

(56) References Cited

U.S. PATENT DOCUMENTS

| | | | |
|---|---|---|---|
| 6,791,102 B2 | 9/2004 | Johnson et al. | 257/3 |
| 6,972,430 B2 | 12/2005 | Casagrande et al. | 257/4 |
| 7,023,009 B2 | 4/2006 | Kostylev et al. | 257/4 |
| 7,317,201 B2 * | 1/2008 | Gutsche et al. | 257/4 |
| 7,476,587 B2 * | 1/2009 | Lung | 438/258 |
| 2006/0175599 A1 | 8/2006 | Happ | 257/4 |
| 2006/0273297 A1 | 12/2006 | Happ | 257/4 |
| 2006/0274575 A1 * | 12/2006 | Lowrey et al. | 365/163 |
| 2006/0284237 A1 | 12/2006 | Park et al. | 257/314 |
| 2007/0063180 A1 | 3/2007 | Asano et al. | 257/3 |
| 2007/0272950 A1 * | 11/2007 | Kim et al. | 257/211 |
| 2007/0020797 A1 | 12/2007 | Pellizzer et al. | 438/95 |

OTHER PUBLICATIONS

Song, Y. et al., "Highly Reliable 256Mb PRAM with Advanced Ring Contact Technology and Novel Encapsulating Technology", VLSI Technology, 2006. Digest of Technical Papers. 2006 Symposium on Jun. 13-15, 2006, pp. 118-119.
Song, Y. J. et al., "Advanced ring type contact technology for high density phase change memory", Solid-State Device Research Conference, 2005. ESSDERC 2005. Proceedings of 35th European, Sep. 12-16, 2005. pp. 513-516.

* cited by examiner

*Primary Examiner* — Jerome Jackson, Jr.
(74) *Attorney, Agent, or Firm* — Ido Tuchman; Vazken Alexanian

(57) ABSTRACT

A method and memory cell including self-converged bottom electrode ring. The method includes forming a step spacer, a top insulating layer, an intermediate insulating layer, and a bottom insulating layer above a substrate. The method includes forming a step spacer within the top insulating layer and the intermediate insulating layer. The step spacer size is easily controlled. The method also includes forming a passage in the bottom insulating layer with the step spacer as a mask. The method includes forming bottom electrode ring within the passage comprising a cup-shaped outer conductive layer within the passage and forming an inner insulating layer within the cup-shaped outer conductive layer. The method including forming a phase change layer above the bottom electrode ring and a top electrode above the bottom electrode ring.

13 Claims, 6 Drawing Sheets

SELF-CONVERGING BOTTOM ELECTRODE RING

BACKGROUND OF THE INVENTION

1. Field of the Invention

The present invention relates to formation of a self-converge bottom electrode ring for non-volatile memory cells and more specifically to phase change memory cells.

2. Description of Background

There are two major groups in computer memory: non-volatile memory and volatile memory. Constant input of energy in order to retain information is not necessary in non-volatile memory but is required in volatile memory. Examples of non-volatile memory devices are optical disks (CDs and DVDs), magnetic hard drives, and phase change memory. Examples of volatile memory devices include DRAM and SRAM. The present invention is directed to phase change memory and the method of forming smaller memory cells in phase change memory devices.

In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase. Often, glass chalcogenides are utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be Ge2Sb2Te5 (GST), SbTe, and In2Se3. However, some phase change materials do not utilize chalcogen such as GeSb. Thus, a variety of materials can be used in a phase change material cell as long as they can retain separate amorphous and crystalline states.

The amorphous and crystalline phases in phase change material are reversible. An electrical pulse traveling through phase change material melts the same due to ohmic heating. A relatively high intensity, short duration pulse causes quick melting and cooling times; the phase change material does not have time to form organized crystals, thereby creating an amorphous phase. A relatively low intensity, long duration pulse allows the phase change material to slowly cool, thus forming organized crystals and is said to be in the crystalline phase. Also, a smaller phase change region results in less energy necessary to melt the phase change material.

Often, a bottom electrode is utilized to heat the phase change material in the phase change region. The shape, size, and formation of the bottom electrode affect the effective qualities of the bottom electrode in providing the current necessary for the phase change in the phase change material. Thus it is desirable to manufacture a bottom electrode that minimizes the energy required for operation while providing evenly distributed heating of the phase change material.

SUMMARY OF THE INVENTION

An exemplary embodiment of the present invention is a method for forming a memory cell structure over a substrate. The substrate can be, but is not limited to, bare silicon substrate, silicon substrate with a layer of insulating material deposited on the top surface of the silicon substrate, or silicon substrate with bottom contacts formed within the silicon substrate.

The method for forming the memory cell structure over the substrate entails depositing a bottom insulating layer of a first insulating material over a substrate, depositing an intermediate insulating layer over the bottom insulating layer of a second insulating material, and depositing a top insulating layer of a third insulating material over the intermediate insulating layer. The second insulating material being separately removable from the first insulating material and the third insulating material being separately removable from the second insulating material. A via forming step forming a via in the top insulating layer and the intermediate insulating layer. An undercutting step forming an undercut in the via such that the top insulating layer overhangs the intermediate insulating layer within the space of the via.

A step spacer forming step forming a step spacer in the via such that a cavity is created over the bottom insulating layer. The size of the cavity is independent of the via size and the lithography. The size of the cavity is dependent on the undercut and a deposition amount. Typically, a bigger via will get more deposition, and smaller via will get less deposition. Therefore, the critical dimension of the cavity will self-converge to the size of the undercut. The step spacer forming step also forms a passage contained within the step spacer extending to the bottom insulating layer. An etching step where the passage in the step spacer is extended through the bottom insulating layer and to the top surface of the substrate. In one particular embodiment of the present invention where the first insulating material and the third insulating material are comprised of the same material, the top insulating layer is also removed during the etching step. A bottom electrode ring forming step forming a bottom electrode ring in the passage within the bottom insulating layer. The bottom electrode being comprising outer conductive material and an inner insulating material. A phase change forming step where phase change material is deposited above the bottom electrode ring. A top electrode forming step where a top electrode is formed above the phase change material.

Another exemplary aspect of the invention is a memory cell structure. The memory cell structure comprised of a substrate. The substrate may be comprised of, but not limited to, bare silicon substrate, silicon substrate with an insulating layer deposited on the top surface of the silicon substrate, or a silicon substrate with bottom contacts formed within the silicon substrate.

The memory cell structure includes a bottom insulating layer above the substrate comprised of a first insulating material. A bottom electrode ring formed within the bottom insulating layer. The bottom electrode ring being comprised of a cup-shaped outer conductive material and an inner insulating material within the outer conductive material. A phase change layer comprised of a phase change material above the bottom electrode and the bottom insulating layer, the bottom electrode ring having a diameter variation less than the diameter variation of the phase change layer. A top electrode comprised of a conductive material formed above the phase change layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
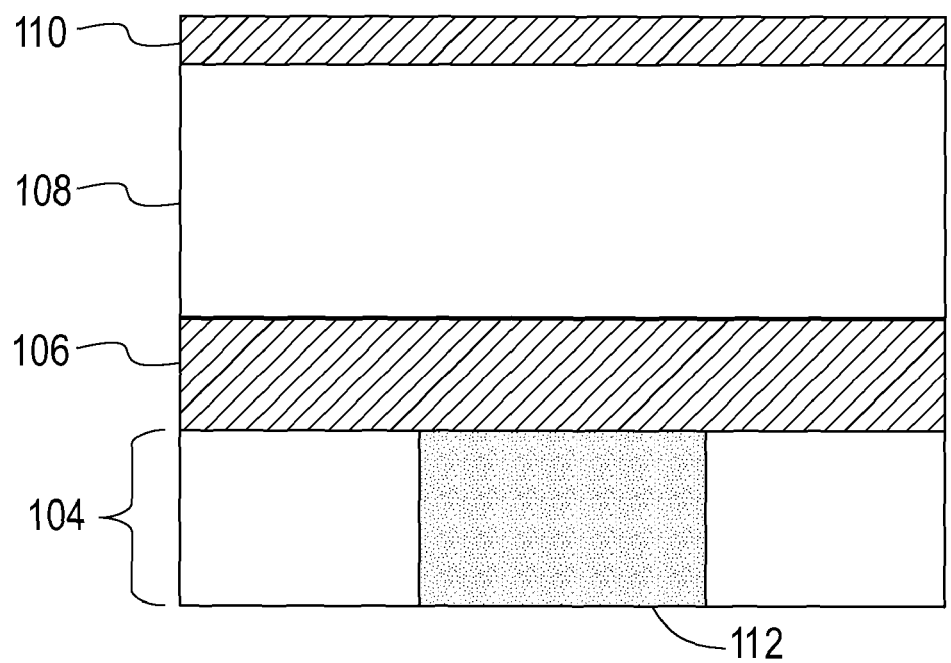
FIG. 1 illustrates a starting wafer, substrate and insulating layers.

The present invention is described with reference to FIGS. 1-11. When referring to the figures, like elements shown throughout are indicated with like reference numerals. The embodiments of the present invention are generally directed to, but are not limited to, forming a self-converging diameter (critical dimension) electrode ring for a phase change memory (PCM) device. The electrode ring can be used to change the state of phase change material in a PCM device.

FIG. 1 illustrates a starting wafer 102. In one particular embodiment of the invention, the starting wafer 102 is comprised of a substrate 104, a bottom insulating layer 106, an intermediate insulating layer 108, a top insulating layer 110, and a bottom contact 112. The substrate 104 may be comprised of silicon, silicon dioxide on silicon, or any other front-end-of-line (FEOL) starting wafer, including access transistors inside the wafer. The bottom contact 112 may be comprised of any conductive material able to carry enough drive current for the PCM device. In one particular embodiment of the invention, the bottom contact 112 is comprised of tungsten (W).

The three insulating layers 106, 108, and 110 may be comprised of any electrically insulating material; however, there are limiting factors. The bottom insulating layer 106 must be separately removable from the intermediate insulating layer 108 and the intermediate insulating layer 108 must be separately removable from the top insulating layer 110. In one particular embodiment of the invention, the bottom insulating layer 106 is comprised of silicon nitride, the intermediate insulating layer 108 is comprised of silicon dioxide, and the top insulating layer 110 is comprised of silicon nitride. Deposition of the three insulating layers is well known to those skilled in the art. For example, a variety of chemical vapor deposition (CVD) processes may be utilized for the deposition.

Figure 2:
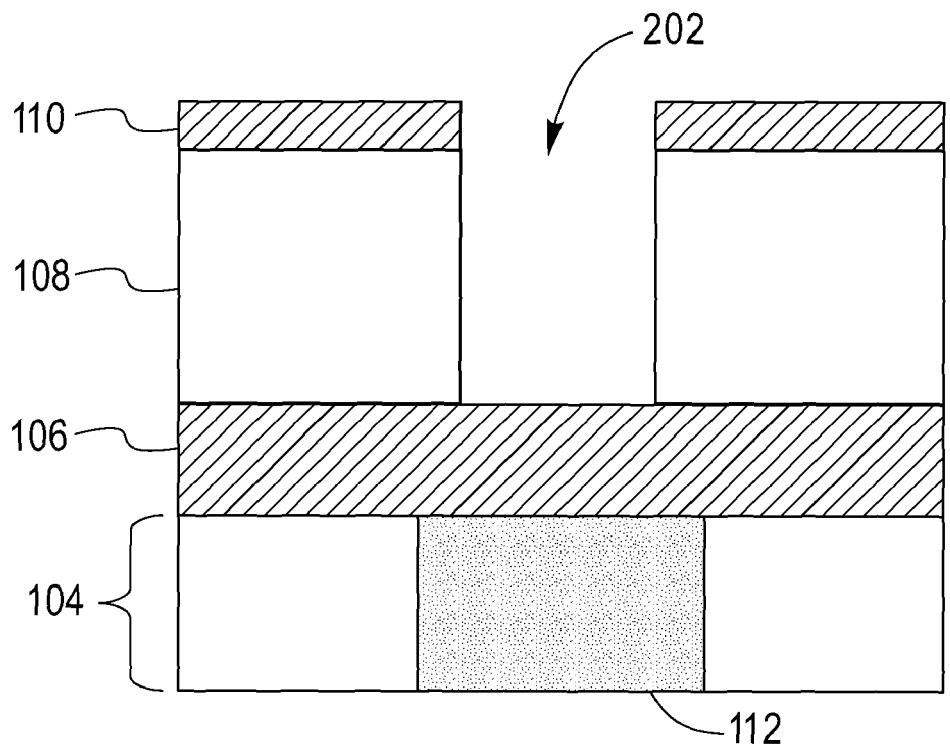
FIG. 2 illustrates a via formation.

Now turning to FIG. 2, a via 202 is formed in the top insulating layer 110 and the intermediate insulating layer 108. The bottom of the via 202 is the top surface of the bottom insulating layer 106. The via 202 may be formed with a lithographic mask and reactive ion etch (RIE) techniques known to those skilled in the art. In one particular embodiment of the invention, the via 202 is formed directly above the bottom electrode 112.

Figure 3:
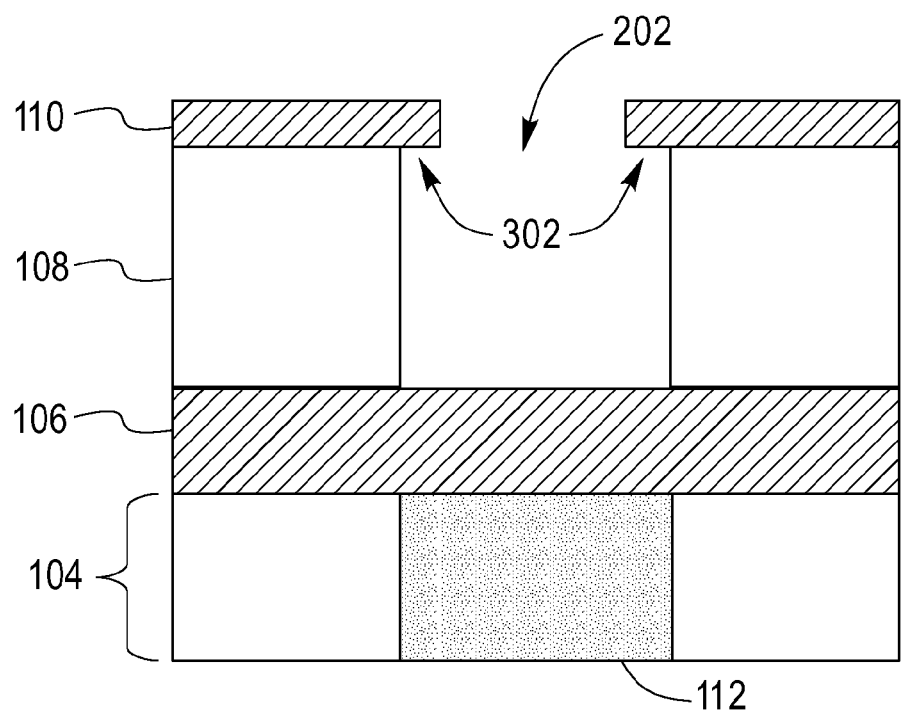
FIG. 3 illustrates undercut formation.

FIG. 3 shows the formation of an undercut 302 in the via 202. The top insulating layer 110 overhangs the intermediate insulating layer 108 within the via. Those skilled in the art will recognize that a variety of wet etches may be employed to form an undercut. The wet etch used is dependent on the materials used for the top insulating layer 110 and the intermediate insulating layer 108. In one particular embodiment of the invention where the top insulating layer 110 is comprised of silicon nitride and the intermediate insulating layer 108 is comprised of silicon dioxide, a dilute hydrofluoric acid (DHF) wet etch is utilized so that the intermediate insulating layer 108 is etched at a much higher rate than the top insulating layer 110 forming the undercut 302.

Figure 4:
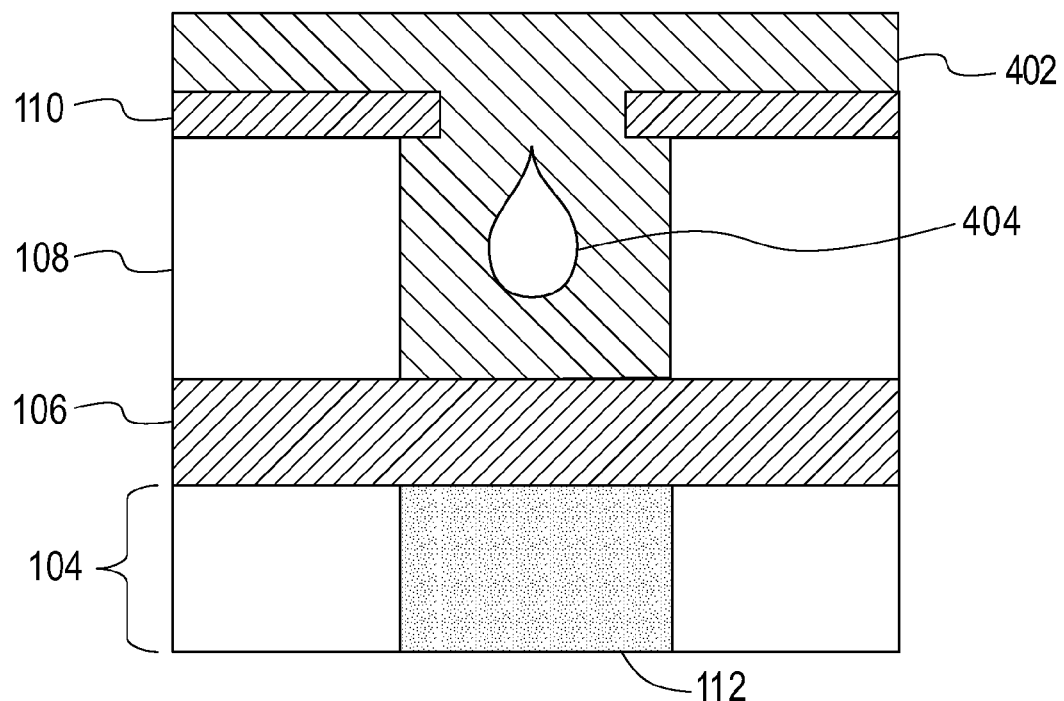
FIG. 4 illustrates spacer material deposition and cavity formation.

In FIG. 4, a highly conformal spacer layer 402 is deposited above the top insulating layer 110 and in the via contained within the intermediate insulating layer 108. A cavity 404 is formed within the spacer layer 402 and approximately in the center of the via 202 (see FIG. 3). The undercut 302 (see FIG. 3) prevents the spacer material from completely filling the via 202. The diameter of the cavity 404 is independent of the diameter of via 202 and is twice the size of the undercut formed between the top insulating layer 110 and the intermediate insulating layer 108. A bigger via 202 will get more deposition, and smaller via 202 will get less deposition. Therefore, the diameter (critical dimension) of the cavity 404 will self-converge to size of the undercut. Furthermore, the critical dimension is independent of the lithography. In one embodiment of the invention, the spacer layer 402 is comprised of amorphous silicon and is deposited utilizing a CVD process.

Figure 5:
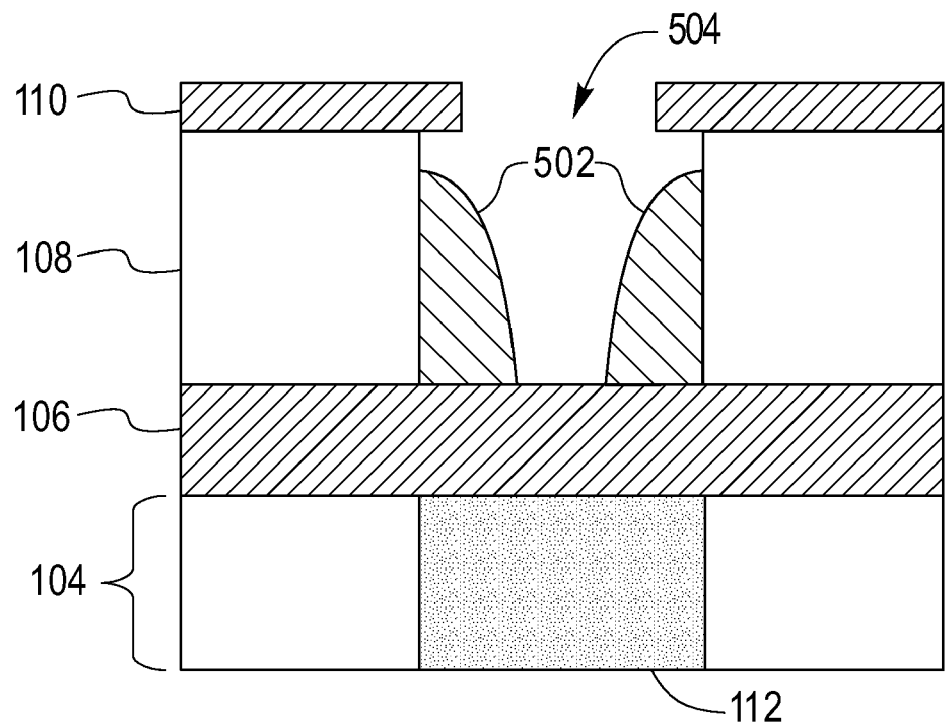
FIG. 5 illustrates step spacer formation.

FIG. 5 illustrates the formation of a step spacer 502 and a passage 504 within the step spacer 502. The step spacer 502 and the passage 504 are formed by etching the spacer layer 402 (see FIG. 4). The cavity 404 (see FIG. 4) causes the etch to penetrate through the center of the via and etch the spacer layer below the cavity before the walls of the step spacer are etched away, thus leaving a ring within the via 202. The passage 504 extends from the top of the step spacer 502 to the top surface of the bottom insulating layer 106. The sidewalls of the passage 504 are the step spacer 502. Those skilled in the art will recognize that a directional RIE processes may be utilized for the etch.

Figure 6:
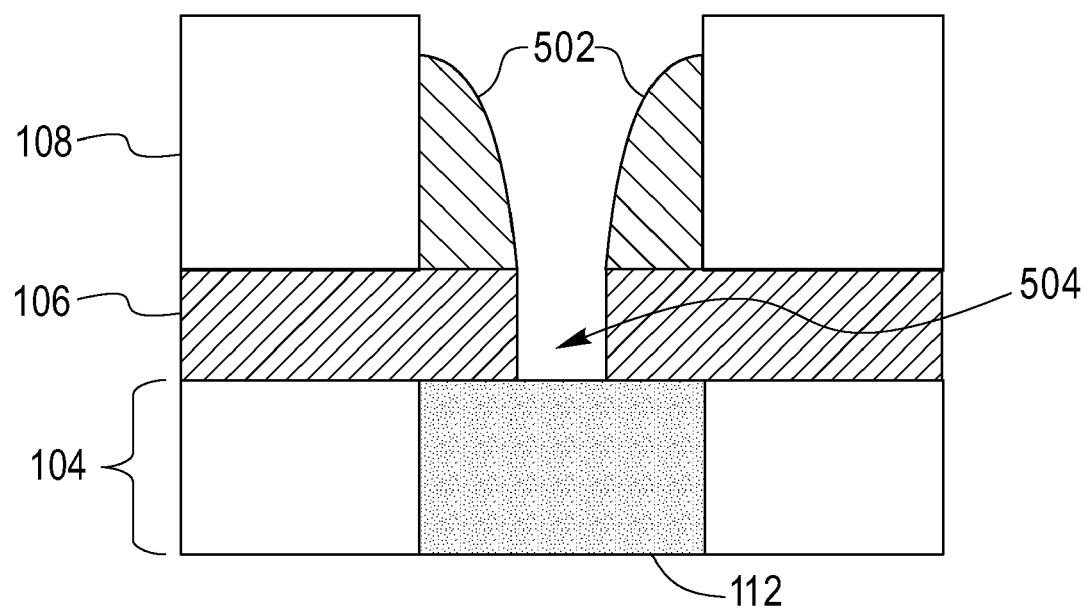
FIG. 6 illustrates passage for bottom electrode ring formation.

Now turning to FIG. 6, the passage 504 is extended through the bottom insulating layer 106. The step spacer 502 is used as a hard mask for an etch into the bottom insulating layer 106. The passage 504 is extend down through the bottom insulating layer 106 so that the bottom of the passage 504 is the top surface of the substrate 104 or the top surface of the bottom contact 112. Additionally, the top insulating layer is also removed. In one particular embodiment of the invention where the top insulating layer and the bottom insulating layer 106 are both comprised of silicon nitride, a directional RIE is employed for etching into the bottom insulating layer 106 and removing the top insulating layer.

Figure 7:
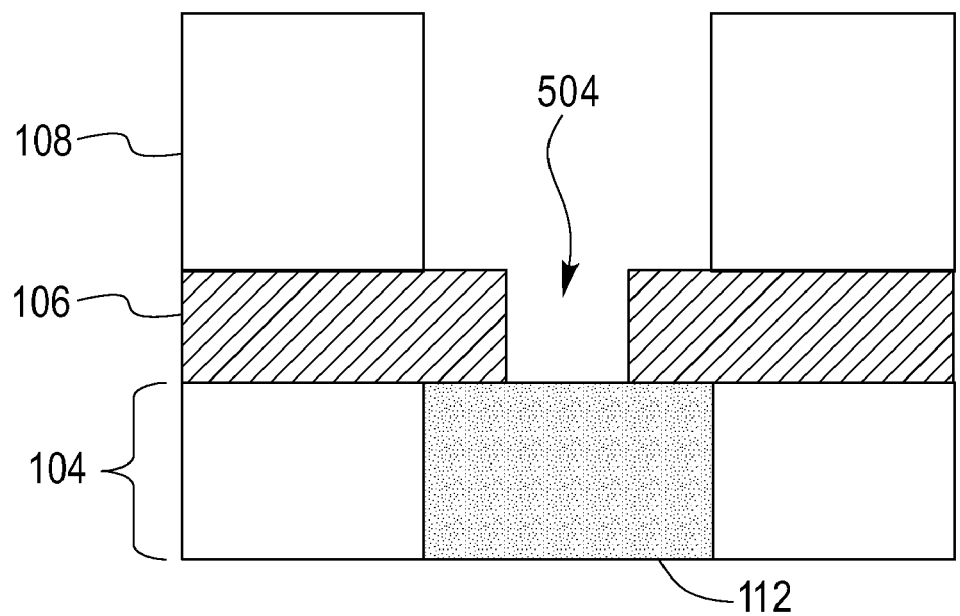
FIG. 7 illustrates step spacer removal.

In FIG. 7, the step spacer is removed. Those skilled in the art will recognize that the etch utilized will be dependent on the type of material used for the step spacer. In one particular embodiment of the invention where the step spacer is comprised of amorphous silicon, potassium hydroxide (KOH) and tetramethylammonium hydroxide (TMAH) are utilized for the etch.

Figure 8:
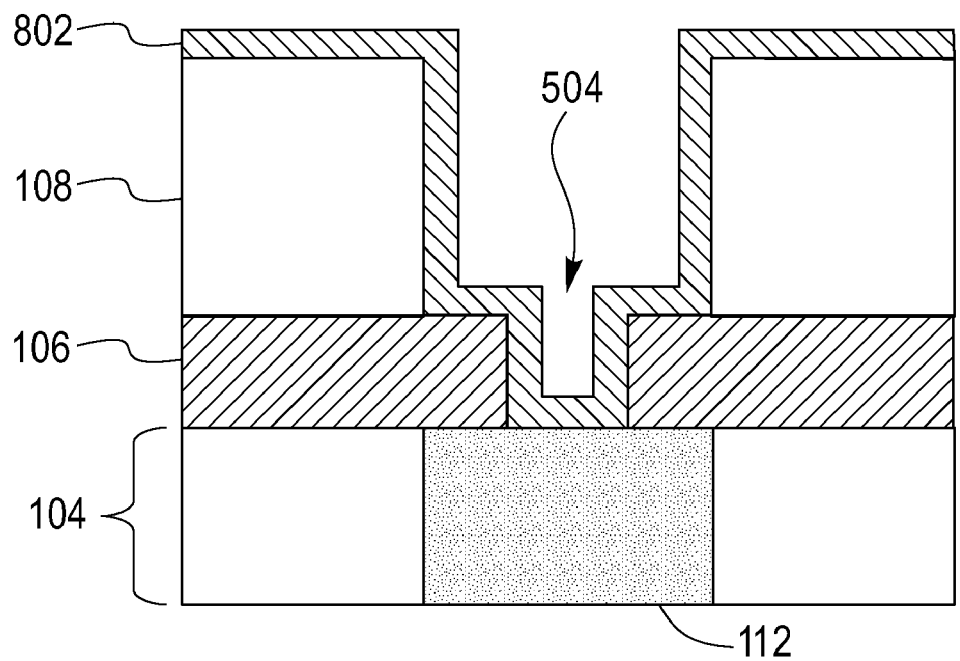
FIGS. 8-10 illustrate bottom electrode ring formation.

FIG. 8 shows the formation of an outer conductive layer 802 comprised of a conductive material. The outer conductive layer 802 is formed along and lines the sidewalls and bottom of passage 504. In one particular embodiment of the invention, the outer conductive layer 802 is in contact with the bottom contact 112. Those skilled in the art will recognize that a variety of electrically conductive materials may be used such as, but not limited to, titanium nitride (TiN) or tantalum nitride (TaN). A normal CVD process may be employed for the deposition of various conductive materials.

Figure 9:
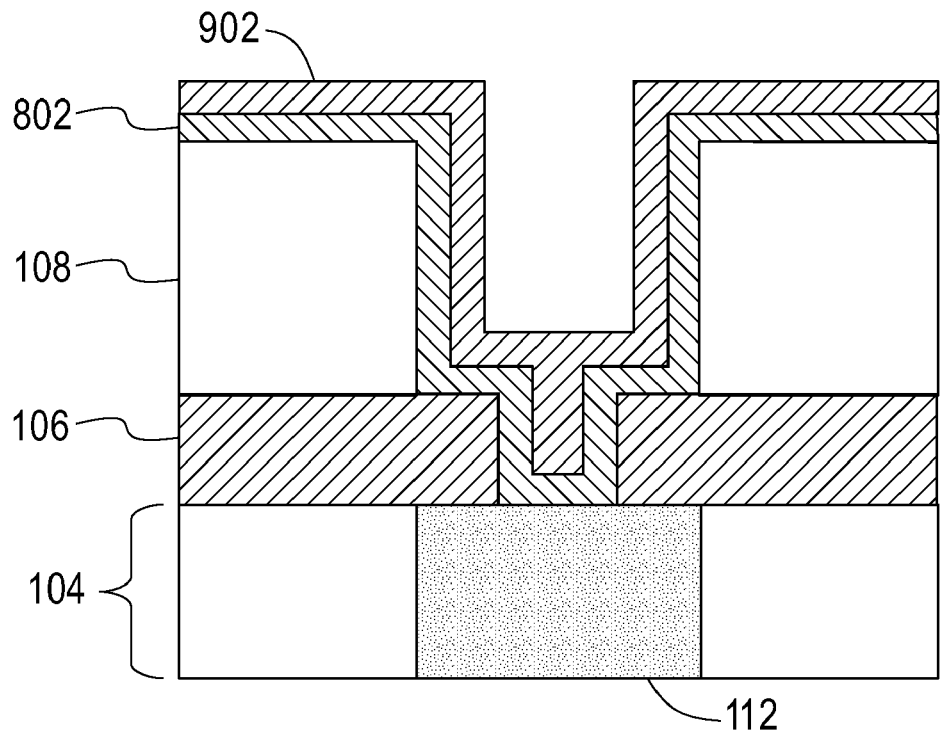

FIG. 9 illustrates the formation of an inner insulating layer 902 comprised of an insulating material. The inner insulating layer 902 is deposited over the outer conductive layer 802 and fills the remainder of the passage. In one embodiment of the invention the inner insulating layer 902 is comprised of silicon nitride. Those skilled in the art will recognize that normal CVD dielectric processes may be utilized for the formation of the inner insulating layer 902.

Figure 10:
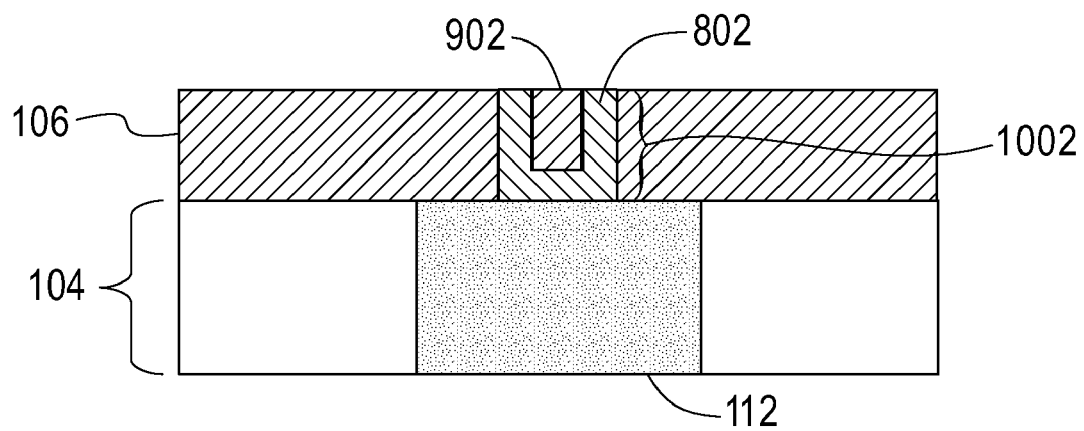

Turning to FIG. 10, the intermediate insulating layer, the inner insulating layer 902 outside of the passage, and the outer conductive layer 802 outside of the passage are removed. Those skilled in the art will recognize that a process such as, but not limited to, a chemical mechanical polish (CMP) may be utilized for the removal of the intermediate insulating layer, the inner insulating layer 902 outside of the passage, and the outer conductive layer 802 outside of the passage.

Removal of the intermediate insulating layer, the inner insulating layer 902 outside of the passage, and the outer conductive layer 802 outside of the passage exposes the top surface of the bottom insulating layer 106 and the top surface of the formed bottom electrode ring 1002. The top surface of the bottom insulating layer 106 and the top surface of the bottom electrode ring 1002 are parallel to the top surface of the substrate, thereby forming a flat surface for deposition of a phase change layer. The bottom electrode ring 1002 is comprised of the outer conductive layer 802 cup containing therein the inner insulating layer 902. The bottom electrode ring 1002 is contained within the bottom insulating layer 106. In one particular embodiment of the invention, the bottom electrode ring 1002 is positioned directly above the bottom contact 112.

Figure 11:
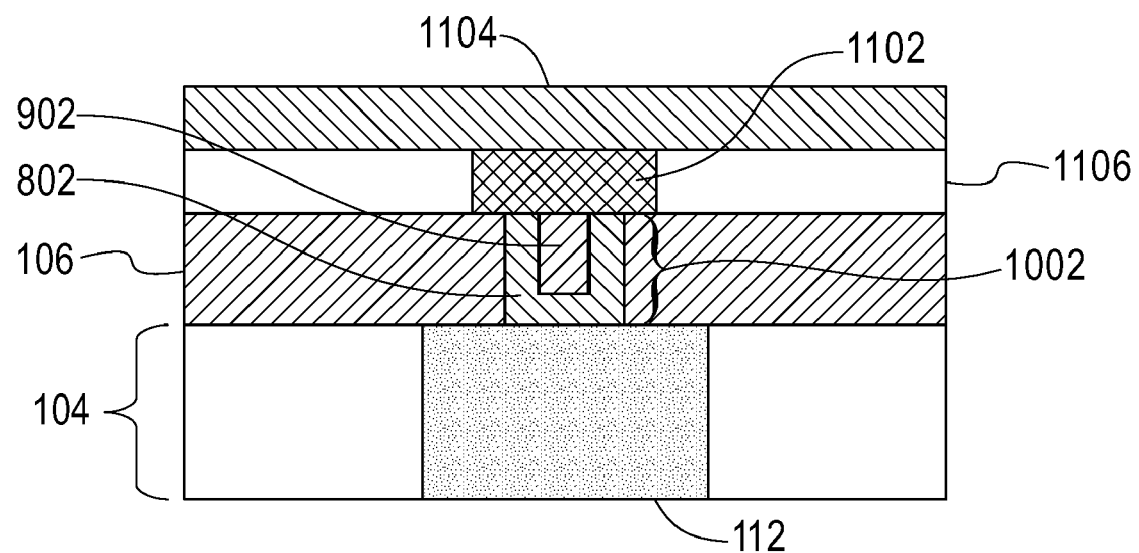
FIG. 11 illustrates phase change element and top electrode formation.

As illustrated in FIG. 11, the phase change layer 1102 and a top electrode 1104 are formed above the bottom insulating layer 106 and the bottom electrode ring 1002. In one embodiment of the invention, the phase change layer 1102 is a block at least as wide as the bottom electrode ring 1002. The top electrode 1104 is formed above the phase change layer 1102. In one particular embodiment of the invention the phase change layer 1102 is comprised of germanium-antimony-tellurium (GST) and the top electrode is comprised of Titanium nitride (TiN). Those skilled in the art will recognize a variety of processes may be utilized for phase change layer 1102 and top electrode 1104 formation, such as, but not limited to, CVD processes for phase change material deposition and metal sputter processes for metal deposition. Moreover, since the bottom electrode 802 was formed as a result of the self-converging cavity 404 (see FIG. 4), the bottom electrode 802 has a diameter variation less than the diameter variation of the phase change layer 1102.

In an alternate embodiment of the invention, the phase change layer 1102 is formed within a phase change insulating layer 1106. The phase change insulating layer 1106 is formed above the bottom insulating layer 106 and above the bottom electrode ring 1002. A trench is then formed above the bottom electrode ring 1002 in the phase change insulating layer 1106 such that the bottom of the trench is the top surface of the bottom electrode ring 1002 and the top surface of the bottom insulating layer 106. The phase change layer 1102 is then formed in the trench. The top electrode 1104 is then formed above the phase change layer 1102 and the phase change insulating layer 1106. In one embodiment of the invention, the phase change insulating layer 1106 is comprised of silicon dioxide. Those skilled in the art will recognize that a variety processes may be employed for the formation of the phase change insulating layer 1106, trench formation, and forming a surface suitable for the formation of the top electrode 1104. These processes may include, but are not limited to, CVD processes for phase change insulating layer 1106 formation, lithographic mask and RIE processes for trench formation, and CMP processes for excess phase change layer 1102 removal.

Having described preferred embodiments for sub-lithographic printing methods (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for forming a memory cell structure, the method comprising:
    forming at least one bottom insulating layer over a substrate, the bottom insulating layer comprised of a first insulating material;
    forming at least one intermediate insulating layer over the substrate, the intermediate insulating layer comprised of a second insulating material, the second insulating material being separately removable from the first insulating material;
    forming at least one top insulating layer over the substrate, the top insulating layer comprised of a third insulating material, the third insulating material being separately removable from the second insulating material;
    forming a via in the top insulating layer and the intermediate insulating layer;
    forming an undercut in the intermediate insulating layer such that the top insulating layer overhangs the intermediate insulating layer within the via;
    forming a step spacer of a spacer material in the via such that a cavity is created over the bottom insulating layer, the cavity dimension being independent of the diameter of the via, the step spacer surrounding a passage, the passage extending to the bottom insulating layer;
    etching the bottom insulating layer such that the passage is extended through the bottom insulating layer;
    removing the step spacer;
    forming a bottom electrode ring filling the passage in the bottom insulating layer completely, the bottom electrode ring comprised of an outer conductive material and an inner insulating material;
    forming a phase change layer comprised of a phase change material over the bottom electrode ring; and
    forming a top electrode layer comprised of a conductive material above the phase change material.

2. The method of claim 1, wherein forming the undercut in the intermediate insulating layer includes etching the intermediate insulating layer such that the top insulating layer overhangs the intermediate insulating layer within the via.

3. The method of claim 1, wherein forming the step spacer includes:
    depositing a spacer layer within the via and along the undercut, the spacer layer containing the cavity; and
    etching the spacer layer such that the passage is formed within the step spacer.

4. The method of claim 3, wherein the spacer layer is comprised of amorphous silicon.

5. The method of claim 1, wherein forming the passage in the bottom insulating layer includes etching the surface of the bottom insulating layer exposed by the passage within the step spacer.

6. The method of claim 1, wherein the substrate includes a bottom contact comprised of conductive material positioned directly below the bottom electrode ring.

7. The method of claim 1, wherein forming the bottom electrode ring includes:
   forming an outer conductive layer comprised of the outer conductive material, the outer conductive layer completely lining the sidewalls and bottom of the passage in the bottom insulating layer;
   forming an inner insulating layer comprised of the inner insulating material, the inner insulating material contained within the outer conductive layer and filling the passage in the bottom insulating layer completely; and
   polishing the bottom insulating layer, the intermediate insulating layer, the outer conductive layer, and the inner insulating layer such that the top surface of the bottom insulating layer, the top surface of the outer conductive layer, and the top surface of the inner insulating layer are parallel to the top surface of the substrate and completely removing the intermediate insulating layer.

8. The method of claim 1, wherein forming the phase change layer includes:
   forming a phase change insulating layer above the bottom electrode ring and above the bottom insulating layer;
   forming trenches in the phase change insulating layer above the bottom electrode ring, the trenches being at least as wide as the bottom electrode ring; and
   filling the trenches with phase change material completely.

9. The method of claim 1, wherein the outer conductive material is tungsten.

10. The method of claim 1, wherein the first insulating material and the third insulating material are silicon nitride.

11. The method of claim 1, wherein the second insulating material is silicon dioxide.

12. The method of claim 1, wherein the inner insulating material is silicon nitride.

13. The method of claim 1, wherein the phase change material is germanium-antimony-tellurium (GST).

* * * * *